United States Patent [19]

Schreurs

[11] 4,388,540
[45] Jun. 14, 1983

[54] CONTROLLABLE MULTIPLIER CIRCUIT WITH EXPANDED GAIN CONTROL RANGE

[75] Inventor: Peter H. M. Schreurs, Eindhoven, Netherlands

[73] Assignee: U.S. Philips Corporation, New York, N.Y.

[21] Appl. No.: 207,326

[22] Filed: Nov. 17, 1980

[30] Foreign Application Priority Data

Nov. 23, 1979 [NL] Netherlands ......................... 7908535

[51] Int. Cl.³ ........................... G06G 7/16; H03G 3/30
[52] U.S. Cl. .................................... 307/493; 307/494; 307/498; 328/160; 330/254
[58] Field of Search ............... 330/138, 254, 278, 280; 328/160; 358/27; 364/841; 307/493, 494, 498, 529

[56] References Cited

FOREIGN PATENT DOCUMENTS 54-47908 8/1979 Japan .................................. 330/254

*Primary Examiner*—James B. Mullins
*Attorney, Agent, or Firm*—Bernard Franzblau; Robert T. Mayer

[57] ABSTRACT

A multiplying circuit comprising a pair of transistors arranged in a long-tailed pair configuration having a collector output and interconnected emitter electrodes coupled to a first current source. A bias voltage adjusting circuit applies equal base bias voltages to the base electrodes of the pair of transistors. The base electrodes are connected to a signal input to provide control of the amplitude of the output signal. The multiplying circuit further comprises a controlled current distribution circuit including a shunting transistor whose collector-emitter path is DC connected in parallel to the pair of transistors. A control circuit supplies a control voltage between the base electrode of the shunting transistor and the base electrodes of the pair of transistors.

12 Claims, 2 Drawing Figures

CONTROLLABLE MULTIPLYING CIRCUIT INCLUDING FIRST AND SECOND TRANSISTORS ARRANGED IN LONG-TAILED PAIR CONFIGURATION HAVING COUPLED EMITTER ELECTRODES

The invention relates to a multiplying circuit comprising a pair of transistors including first and second transistors arranged in a long-tailed pair configuration having a collector output and interconnected emitter electrodes which are coupled to a first current source. The circuit also comprises a bias voltage adjusting circuit for applying an equal base bias voltage to the base electrodes of the pair of transistors, the base electrodes being connected to a signal input.

Such a multiplying circuit is described in Dutch Patent Application No. 7113892, which corresponds to U.S. Pat. No. 3,812,434.

In the known multiplying circuit the maximum amplitude of the signal input at which amplitude limiting of the output signal is about to occur is determined by the collector voltage differential at the collector output of the pair of transistors. The collector voltage differential is the voltage difference between the supply voltage and the transistor collector voltage at its quiescent bias point and determines the maximum amplitude of input signal that can be processed without distortion. Amplitude limiting introduces signal distortion in an AM-modulated signal. Such amplitude limiting causes higher signal harmonics, which may produce annoying interference in a circuit which follows after the multiplying circuit. So the said collector voltage space limits the range in which an undistorted signal processing is possible.

The collector voltage differential can be increased by increasing the supply voltage. As a result thereof input signals of a greater amplitude can be processed before limiting of the output signal occurs. However, the energy dissipation in the variable resistors of the transistors increases with increasing supply voltage. The aim is to minimize the energy dissipation and to keep the number of different supply voltages in an apparatus as low as possible. In practice this virtually excludes the possibility of using a high supply voltage to increase the signal processing of the prior art multiplying circuit. In addition, with battery-fed apparatus the supply voltage decreases during use owing to energy consumption thereby causing the signal processing to decrease.

It is an object of the invention to provide a multiplying circuit which has a large signal processing range and a large control range, also at low supply voltages.

According to the invention, a multiplying circuit of the type described in the opening paragraph is therefore characterized in that the multiplying circuit also comprises a controlled current distribution circuit including a shunting transistor whose collector-emitter path is DC connected in parallel with the collector-emitter path of the two first-mentioned transistors. The invention also comprises a control circuit for applying a control voltage between the base electrode of the shunting transistor and that of the transistor pair.

When the measure according to the invention is used, an increasing control voltage is applied between the base electrode of the shunting transistor and that of the transistor pair with an increasing signal current from the first current source, which causes the current conduction of the shunting transistor to increase with respect to that of the transistor pair. In this manner a controllable portion of the signal current is short-circuited to ground, so that amplitude limiting of the output signal is prevented, even with strong input signals.

A preferred embodiment of a multiplying circuit according to the invention is characterized in that the first current source is controllable and coupled to the control circuit, this control circuit including a threshold circuit to provide a substantially sequential control of the first current source and the current distribution circuit.

When this measure is used, the signal control circuit comprising the control current distribution circuit is added to a known signal control circuit including a first controlled current source. The last-mentioned known signal control circuit is described in the above-mentioned Netherlands Patent Application No. 7113892. Herein use is made of the known fact that the amplification of a transistor can be controlled by a controlling of the collector-emitter current through this transistor. When, however, strong input signals are applied between the base and the emitter electrode of the latter transistor, then strong non-linear signal distortions occur due to clipping effects at the output.

By using the last-mentioned preferred measure the signal processing range of the known multiplying circuit can be enlarged with that of the current distribution circuit without signal distortions being produced. Furthermore, as the shunting transistor is DC connected in parallel with the first and the second transistors, the size of the collector voltage differential at the collector output of the pair of transistors is not affected.

A still further preferred embodiment of a multiplying circuit according to the invention is characterized in that the first controllable current source is coupled to an aerial signal input and comprises first and second balanced outputs. The first output is coupled to the emitter electrode of said pair of transistors and the second output is coupled to the emitter electrodes of a further pair of transistors which is identical thereto and which includes third and fourth transistors. A further shunting transistor of the controlled current-distribution circuit is DC connected in parallel with the collector-emitter path of this further pair of transistors. The base electrodes of the first and the fourth transistors are AC connected to ground and the base electrodes of the second and the third transistors are connected to a signal terminal of the signal input. A controllable oscillator is connected to this signal terminal.

When this measure is used the multiplying circuit functions as a controllable mixing stage, an aerial signal being multiplied by an oscillator signal. The control signal applied to the control input of the control circuit may then originate from an ACG generating device and is used to keep the output signal of the multiplying circuit at a constant amplitude.

A further preferred embodiment of this multiplying circuit is characterized in that the collectors of the first and the second transistors are connected to a supply line and the collectors of the second and the fourth transistors to a signal output. This signal output is coupled to the supply line via a series arrangement of a resistor and two limiting diodes which are connected in anti-parallel.

By the use of this measure, when a sufficient control signal is lacking at the control input of the control circuit, the output signal of the multiplying circuit is limited to suppress tuning effects then for example, when used in receivers.

The invention will now be further explained by way of non-limitative example with reference to the Figures shown in the accompanying drawing in which.

Figures 1, 2:
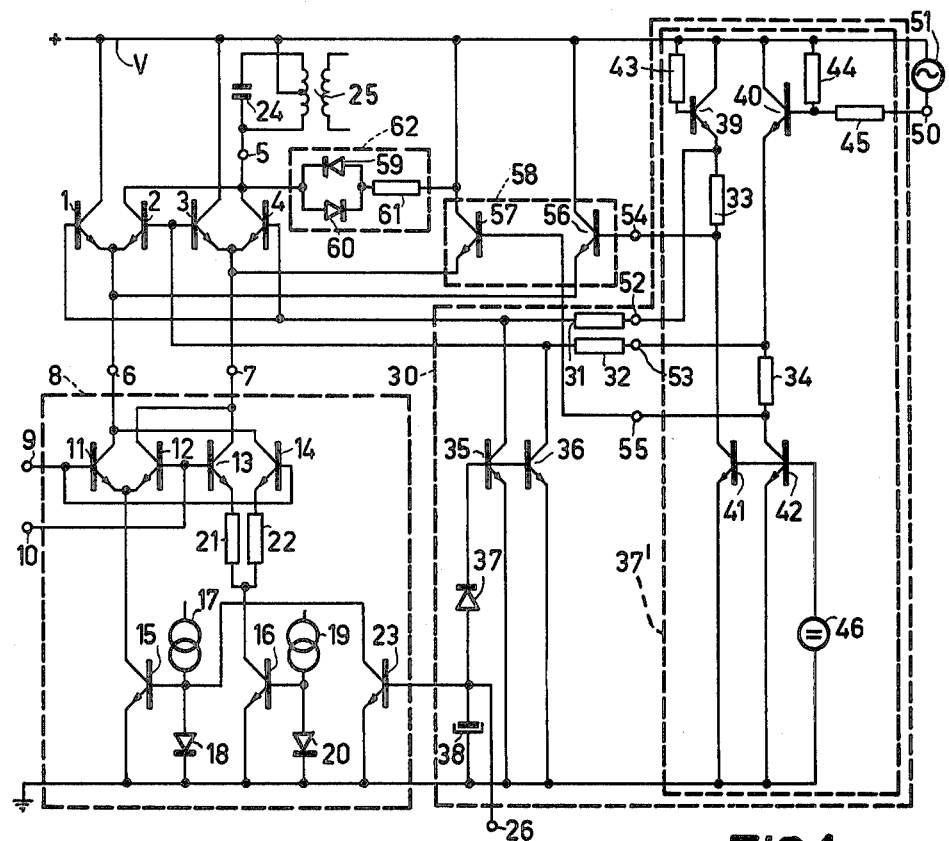
FIG. 1 shows a multiplying circuit according to the invention.
FIG. 2 shows a second embodiment of a control circuit usable in the multiplying circuit of the preceding Figure.

FIG. 1 shows a multiplying circuit according to the invention comprising a pair of transistors including first and second transistors 1 and 2 arranged in long-tailed pair configuration and a further pair of transistors including third and fourth transistors 3 and 4, also arranged in long-tailed pair configuration. The emitter electrodes of the transistors 1 and 2 and those of the transistors 3 and 4, respectively, are intercoupled and connected to a controllable current source 8 via balanced outputs 6 and 7 thereof. The base electrodes of transistors 1 and 4 are intercoupled and AC connected to ground. The base electrodes of the transistors 2 and 3 are also intercoupled and connected to an oscillator 51 via an input signal terminal 50. The collector electrodes of transistors 1 and 3 are connected to a supply line V and those of the transistors 2 and 4 to a signal output 5. The signal output 5 is DC connected to the supply line V via an outcoupling circuit 24, 25.

The controllable current source 8 comprises two pairs of transistors, including the respective transistors 11 and 12, 13 and 14. The bases of the transistors 11 and 14 and those of the transistors 12 and 13, respectively, are intercoupled and connected to aerial input terminals 9 and 10, respectively. The emitters of transistors 11 and 12 are intercoupled and connected to the collector of a controlled current source transistor 15. Via negative feedback resistors 21 and 22 the emitters of the transistors 13 and 14 are coupled to the collector of a current source transistor 16, which is adjusted to a constant current intensity. The bases of the said current source transistors 15 and 16 respectively are coupled to a base voltage adjusting circuit 17, 18 and 19, 20, respectively. Each of these circuits consist of a series arrangement of a current source 17 and 19, respectively, and a diode 18 and 20, respectively. The base of the controlled current source transistor 15 is also coupled to the collector of a control transistor 23. The base of this control transistor 23 is connected to a control input 26 of a control circuit 30.

An AGG-voltage which increases with an increasing aerial signal at the aerial input terminals 9 and 10 is connected to the control input 26 of the control circuit 30. An increasing AGC-voltage results in a decreasing collector current of the current source transistor 15 and consequently in a decreasing signal gain of the pair of transistors 11, 12. In the controllable current source 8, the output signal at the balanced output 6 and 7 and consequently the output signal at the signal output 5 are thus kept at a constant value.

However, when the amplitude of the aerial signal continues to increase still further the control signal amplification of the pair of transistors 11, 12 decreases at a given moment to below the constant signal amplification of the pair of transistors 13, 14. At that instant the limit of the control range of the known controllable current source 8 has been reached and with a still further increase of aerial signal amplitude, the output signal at the signal output 5 also will increase.

Further discussion of the operation of the circuit described so far which comprises the elements 1 to 23 inclusive is not necessary for an understanding of the invention. For a detailed description of the last-mentioned circuit reference is made to the above-mentioned Netherlands Patent Application No. 7113892.

The control circuit 30 includes a threshold circuit consisting of a switching diode 37 arranged between the control input 26 and the bases of the control transistors 35 and 36. The control input 26 is connected to ground via a by-pass capacitor 38. The control transistors 35 and 36 function as a second controllable current source. The emitters of these control transistors 35 and 36 are connected to ground. The collector of the control transistor 35 is connected to the bases of the transistors 1 and 4 and, also via a first control resistor 31, to a first voltage reference terminal 52 of a bias voltage adjusting circuit 37'. The collector of the control transistor 36 is connected to the bases of the transistors 2 and 3, and also via a second control resistor 32, to a second voltage reference terminal 53 of the bias voltage adjusting circuit 37'. The two control resistors 31 and 32 are of equal value.

The bias voltage adjusting circuit 37' includes transistors 39 and 40, which function as diodes and whose collectors are connected to the supply line V. The collector-base junctions of the transistors are DC short-circuited via a resistor 43 and a parallel arrangement of resistors 44 and 45, respectively. The resistor 43 has a value which is equal to the resistance value of the parallel arrangement of the resistors 44 and 45. The resistor 45 is coupled to the input signal terminal 50. The emitters of the transistors 39 and 40 are connected to the voltage reference terminals 52 and 53, respectively, and also, via biasing resistors 33 and 34, to the collectors of current source transistors 41 and 42. The current source transistors 41 and 42 are connected to ground by means of their emitters and are coupled to a bias voltage source 46 by means of their bases.

The connections between the biasing resistor 33 and the current source transistor 41 and between the biasing resistor 34 and current source transistor 42 are coupled to third and fourth voltage reference terminals 54 and 55, respectively. The third and fourth voltage reference terminals 54 and 55 are coupled to the bases of shunting transistors 56 and 57, respectively, which are part of a controlled current distribution circuit 58. The collectors of the two shunting transistors 56 and 57 are connected to the supply line V, the emitters are coupled to the common emitters of the transistors 1 and 2 and to the common emitters of the transistors 3 and 4, respectively.

A limiting circuit 62 is arranged in parallel without an out couple element 24, 25 between the signal output 5 and the supply line V and comprises a series arrangement of a linearizing resistor 61 and two limiting diodes 59 and 60, which are connected in anti-parallel.

Via the first and second voltage reference terminals 52 and 53 and the equal control resistors 31 and 32 the bias voltage adjusting circuit 37' applies an equal base bias voltage to the transistors 1 to 4, inclusive, and via the third and fourth voltage reference terminals 54 and 55 a lower equal base voltage, which is adjustable by means of the biasing resistors 33 and 34, to the shunting transistors 56 and 57. An oscillation signal which is received from the oscillator 51 and is asymmetrically applied to the bases of the transistors 2 and 3 is superimposed on the voltage at the voltage reference terminal 53. The bases of the transistors 1 and 4 are AC connected to ground.

In the pairs of transistors 1, 2 and 3, 4 the oscillation signal is multiplicatively mixed with the aerial signal which was amplified in the controlled current source circuit 8. Outcoupling of the desired mixed product is carried out at the signal output 5 by means of the outcoupling circuit 24, 25.

The switching diode 37 is non-conductive at an increase in the amplitude of the AGC-signal at the control input 26 in response to an increase of the aerial signal amplitude within the control range of the known circuit 1 to 23 inclusive. When the limit of this control range is reached, that is to say when the signal amplification will take place predominantly in the pair of transistors 13, 14, the AGC-voltage has increased to such an extent that the diode 37 is rendered conductive. The control transistors 35 and 36 then start carrying current, causing an equal voltage drop to be produced across the control resistors 31 and 32, and the base bias voltages of the transistors 1 to 4, inclusive, to decrease to an equal extent. This decrease of the bias voltage results also in a decrease of the emitter voltages of the transistors 1 to 4 inclusive. Because the voltages at the third and fourth voltage reference terminals 54 and 55 are substantially constant, the base-emitter voltages of the shunting transistors 56 and 57 increase to an equal extent so that these transistors are rendered conductive when a certain threshold voltage is exceeded. The said threshold voltage is not only determined by the switching diode 37 but also by the value of the biasing resistors 33 and 34 and the control resistors 31 and 32. When the shunting transistors 56 and 57 are conductive, a portion of the currents produced by the control current source 8 at the balanced outputs 6 and 7 is short-circuited to the supply line V via the shunting transistors 56 and 57, respectively. This causes the amplitude of the output signal at the signal output 5 to decrease to a desired value.

When the AGC-voltage increases still further, the short-circuited currents through the shunting transistors 56 and 57 may become larger than the currents through the transistors 1 through 4, inclusive, and in the extreme case they may even short-circuit the total current of the balanced outputs 6 and 7. As a result thereof the control range of the multiplying circuit according to the invention is almost unlimited.

Although the multiplying circuit according to the invention is shown as a mixing stage and has been combined with a controlled current source 8, it is also possible to set the current source 8 to a constant value and to use only the signal control obtained by means of the control circuit 30, the bias voltage adjusting circuit 37' and the current distribution circuit 58. Such a signal control may be used in, for example, signal amplifiers.

As the shunting transistors 56 and 57 are arranged in parallel with the transistors 1 to 4 inclusive, the voltage required for adjusting these shunting transistors 56 and 57 is not to the detriment of the collector voltage differential at the signal output 5, and the operating range of the last-mentioned signal control may extend to very low supply voltages.

An increase of the currents through the shunting transistors 56 and 57 causes, as mentioned above, a decrease of the currents through the pairs of transistors 1, 2 and 3, 4. Consequently, a decrease of the differential resistance of the transistors 56 and 57 is accompanied by an increase of the differential resistances of the transistors 1 to 4, respectively, and the load for the oscillator 51 at the voltage reference terminal 53 remains constant during the signal control. A shift of the oscillation frequency owing to load variations during the control is thereby prevented.

In addition, because of the balanced construction of the current distribution circuit 58, a compensation of the short-circuited signal current is effected at the collector lead of the shunting transistors 56 and 57, without these signal currents coupling to the supply line V so as to introduce disturbances elsewhere in the circuit.

In an embodiment, now shown, of the amplifying circuit according to the invention, the biasing resistors 33 and 34 are omitted and the voltage reference terminals 54 and 55 are short-circuited respectively with terminals 52 and 53. In order to prevent in the last-mentioned embodiment a too large current from being short-circuited by the shunting transistors 56 and 57 before the control action takes place, which would cause the noise contribution of these shunting transistors 56 and 57 to become impermissibly high, the emitter surface areas of the transistors 1 to 4, inclusive, have been chosen a few times larger than those of the shunting transistors 56 and 57. In practice, such a measure is combined with the use of variable resistors 33 and 34, as shown, to effect an accurate adjustment of the current through the shunting transistors 56 and 57 as a function of the AGC-voltage at the control input 26.

When the shown multiplying circuit according to the invention is used in a receiver, it may happen that upon tuning onto a station an insufficient AGC-voltage is applied to the control input 26 so that a too weak signal control takes place. Then the current source transistor 15 produces a current of too high an intensity and the signal amplification in the transistors 11 and 12 is then also too strong. As a consequence thereof the signal at the signal output 5 may be considerably distorted. In order to limit the amplitude of the signal, the limiting circuit 62 has been included in the shown embodiments of the multiplying circuit. The diodes 59 and 60 of this limiting circuit 62, which are connected in anti-parallel, limit the amplitude of noise signals at the signal output 5 to a value determined by the diode switching voltage. The linearising resistor 61 causes this amplitude limitation to proceed gradually to some extent.

In a practical construction of the shown multiplying circuit according to the invention the elements had the following values:

| Resistor: | value ($\Omega$): | capacitor: | value: |
| --- | --- | --- | --- |
| 21 | 1.5 k | 38 | 5 $\mu$F |
| 22 | 1.5 k | 24 | 180 pF |
| 31 | 680 | | |
| 32 | 680 | | |
| 33 | 470 | | |
| 34 | 470 | | |
| 43 | 1.5 k | | |
| 44 | 4.7 k | | |
| 45 | 2.2 k | | |
| 61 | 1 k | | |

FIG. 2 shows a second embodiment of a control circuit suitable for use in a multiplying circuit according to the invention. The elements corresponding to the elements of FIG. 1 have been given the same reference numerals.

The control input 26 of the control circuit 30 is coupled to the common bases of the control transistors 35 and 36 and is also connected to ground via a series arrangement of a threshold resistor 71 and an emitter resistor 72 included in the emitter lead of the source transistor 15, the series arrangement functioning as a threshold circuit.

The emitters of the control transistors 35 and 36 are intercoupled and connected to ground via the threshold resistor 70 and the emitter resistor 72. The base voltage adjusting circuit of the current source transistor 15 comprises a further diode 18′ through which the diode 18 is connected to ground. The anode and the cathode of the diode 18 are coupled to the base of the current source transistor 15 via a resistor 63 and a resistor 64, respectively.

The emitter resistor 72 effects a negative feedback for noise signals which may be produced across the diodes 18 and 18′ and consequently furnishes a decrease of the noise contribution of transistor 15 to the multiplying circuit.

An increase of the AGC-voltage at the control input 26 results in an increase of the voltage across the emitter resistor 72. This causes the base-emitter voltage of the current source transistor 15 to decrease and, consequently, also the collector current thereof.

The threshold resistor 71 has been chosen so that in the control range of the current source transistor 15 the voltage across this threshold transistor is sufficiently low to keep the control transistors 35 and 36 in the closed, or substantially closed, state.

If the limit of the control range of the current source transistor 15 is reached at a given value of the AGC-voltage, then the control transistors 35 and 36 are rendered conductive. The resistor 70 determines the control amplification, that is to say the extent to which the collector currents of the control transistors 35 and 36 increase and decrease respectively, depending on the AGC-voltage.

In a practical embodiment the elements had the following values:

| Resistor: | value ($\Omega$): |
|---|---|
| 31 | 680 |
| 32 | 680 |
| 70 | 330 |
| 71 | 470 |
| 72 | 220 |
| 63 | 3 k |
| 64 | 1.8 k |

What is claimed is:

1. A multiplying circuit comprising first and second transistors arranged in a long-tailed pair configuration having a collector output and interconnected emitter electrodes coupled to a first current source, a bias voltage adjusting circuit for applying equal base bias voltages to the base electrodes of the first and second transistors, means connecting said base electrodes to a signal input, a controlled current distribution circuit including a shunting transistor having a collector-emitter path DC coupled in parallel with said first and second transistors, and a control circuit for applying a control voltage between a base electrode of the shunting transistor and the base electrodes of the first and second transistors.

2. A multiplying circuit as claimed in claim 1, wherein the first current source is controllable and coupled to the control circuit, and the control circuit includes a threshold circuit for a sequential control of the first current source and the current distribution circuit.

3. A multiplying circuit as claimed in claim 2, characterized in that the current distibution circuit is connected to a control input of the control circuit via the threshold circuit, said threshold circuit including a series arrangement of two resistors for producing thereacross a control voltage for the first controllable current source and the current distribution circuit, and means coupling an output of the threshold circuit via a first control resistor to a reference voltage for producing thereacross a variable part of said control voltage between the base of the shunting transistor and the bases of the first and second transistors.

4. A multiplying circuit as claimed in claims 1 or 2 wherein the control circuit includes a second controllable current source connected to a control input of the current distribution circuit.

5. A multiplying circuit as claimed in claim 3 wherein the control circuit includes a second controllable current source connected to a control input of the current distribution circuit, means coupling to the reference voltage the base of the first transistor via the first control resistor, the base of the second transistor via a second control resistor and the base of the shunting transistor via a biasing resistor, said second controllable current source having first and second current outputs coupled to the bases of the first and second transistors, respectively, for varying the base-emitter voltages of the first and second transistors to the same extent in the case of a control of the second controllable current source.

6. A multiplying circuit as claimed in claims 1 or 2 wherein the first controllable current source is coupled to an aerial signal input and comprises first and second balanced outputs, the first output being coupled to the emitter electrodes of said first and second transistors and the second output being coupled to emitter electrodes of third and fourth transistors, a second shunting transistor of the controlled current distribution circuit being DC connected in parallel with the collector emitter paths of the third and fourth transistors, the base electrodes of the first and fourth transistors being AC connected to ground and the base electrodes of the second and third transistors being connected to a signal terminal of the signal input, and a controllable oscillator connected to the signal terminal.

7. A multiplying circuit as claimed in claims 1 or 2 wherein the emitter surface area of the first and of the second transistor is larger than that of the shunting transistor.

8. A multiplying circuit as claimed in claim 6, wherein the collectors of the first and third transistors are connected to the supply line and the collectors of a second and fourth transistors to a signal output, said signal output being coupled to the supply line via a series arrangement of a resistor and two limiting diodes connected in antiparallel.

9. A multiplying circuit comprising a pair of first and second transistors arranged in a long-tailed pair configuration and having a collector connected to an output terminal and interconnected emitter electrodes coupled to a first controllable current source, a bias voltage adjusting circuit for applying equal base bias voltages to respective base electrodes of the first and second transistors, means coupling said base electrodes to a first signal input means, second signal input means coupled to a control terminal of the first controllable current source, a controlled current distribution circuit including a third transistor DC coupled in shunt with said first and second transistors, and a control circuit for applying a control voltage to the base electrodes of said first, second and third transistors such that an increase of signal current from the first current source causes an increase in the control voltage at the base of the third transistor relative to that at the bases of the first and second transistors.

10. A multiplying circuit as claimed in claim 9 further comprising a control terminal for applying a control voltage to an input of said control circuit and to an input of said first current source.

11. A multiyling circuit as claimed in claim 10 wherein said control circuit includes means for controlling the operation of the current distribution circuit and a threshold circuit that inhibits operation thereof for signals below a given level thereby to produce a sequential control of said first and second transistors by said first current source and said current distribution circuit.

12. A multiplying circuit as claimed in claim 9 further comprising a pair of fourth and fifth transistors arranged in a long-tailed pair configuration and having a collector connected to said output terminal and interconnected emitter electrodes coupled to said first controllable current source, means connecting the base electrodes of the fourth and fifth transistors to the base electrodes of the second and first transistors, respectively, said current distribution circuit including a sixth transistor DC coupled in shunt with said fourth and fifth transistors, and wherein said control circuit applies a control voltage to the base electrodes of said fourth, fifth and sixth transistors.

* * * * *

UNITED STATES PATENT AND TRADEMARK OFFICE
CERTIFICATE OF CORRECTION

PATENT NO. : 4,388,540

DATED : June 14, 1983

INVENTOR(S) : PETER H.M. SCHREURS

It is certified that error appears in the above-identified patent and that said Letters Patent is hereby corrected as shown below:

Column 1, line 33, change "space" to --differential--

Claim 2, line 4, after "for" insert --providing--

Claim 8, line 3, change "a" to --the--

Claim 11, line 1, change "multiyling" to --multiplying--

Signed and Sealed this

Second Day of July 1985

[SEAL]

Attest:

DONALD J. QUIGG

Attesting Officer     Acting Commissioner of Patents and Trademarks